United States Patent [19]
Kim et al.

[11] Patent Number: 6,002,629
[45] Date of Patent: Dec. 14, 1999

[54] INTEGRATED CIRCUIT MEMORY DEVICES HAVING IMPROVED REFRESH MODE ADDRESSING AND METHODS OF OPERATING SAME

[75] Inventors: Jeon-Kyu Kim; Chang-Hag Oh, both of Kyunggi-do; Choong-Sun Park; Jeon-Hyoung Lee, both of Seoul, all of Rep. of Korea

[73] Assignee: Samsung Electronics Co., Ltd., Rep. of Korea

[21] Appl. No.: 09/206,683

[22] Filed: Dec. 7, 1998

[30] Foreign Application Priority Data

Dec. 6, 1997 [KR] Rep. of Korea ............. 97-66535

[51] Int. Cl.$^6$ .................................................. G11C 7/00
[52] U.S. Cl. .......................................... 365/222; 365/239
[58] Field of Search ................................ 365/222, 230.06, 365/230.08, 233.5, 236, 239, 185.04

[56] References Cited

U.S. PATENT DOCUMENTS

| | | | |
|---|---|---|---|
| 4,809,233 | 2/1989 | Takemae | 365/222 |
| 4,939,695 | 7/1990 | Isobe et al. | 365/222 |
| 4,943,960 | 7/1990 | Komatsu et al. | 365/222 |
| 5,315,557 | 5/1994 | Kim et al. | 365/222 |
| 5,629,898 | 5/1997 | Idei et al. | 365/222 |
| 5,822,264 | 10/1998 | Tomishima et al. | 365/222 |

*Primary Examiner*—David Nelms
*Assistant Examiner*—Thong Le
*Attorney, Agent, or Firm*—Myers Bigel Sibley & Sajovec

[57] ABSTRACT

Integrated circuit memory devices include an array of memory cells and a row address generator circuit which generates first and second different sequences of addresses during first and second refresh modes, respectively, and also repeats at least one of the addresses in the first sequence as an address in the second sequence when transitioning from the first refresh mode to the second refresh mode. The generator circuit may also perform the function of generating row addresses during the first and second refresh modes with the most significant bit of a row address being toggled with each consecutive row address during the first refresh mode. The first refresh mode may be a CAS-before-RAS refresh mode, the second refresh mode may be a self-refresh mode and the address in at least one of the first and second periods of the self-refresh mode may be equivalent to an address in the last period of a preceding CAS-before-RAS refresh mode when transitioning from the first refresh mode to the second refresh mode. This repetition in addressing prevents one or more row of memory cells from being skipped when transitioning from one refresh mode to another refresh mode.

17 Claims, 12 Drawing Sheets

Fig. 7
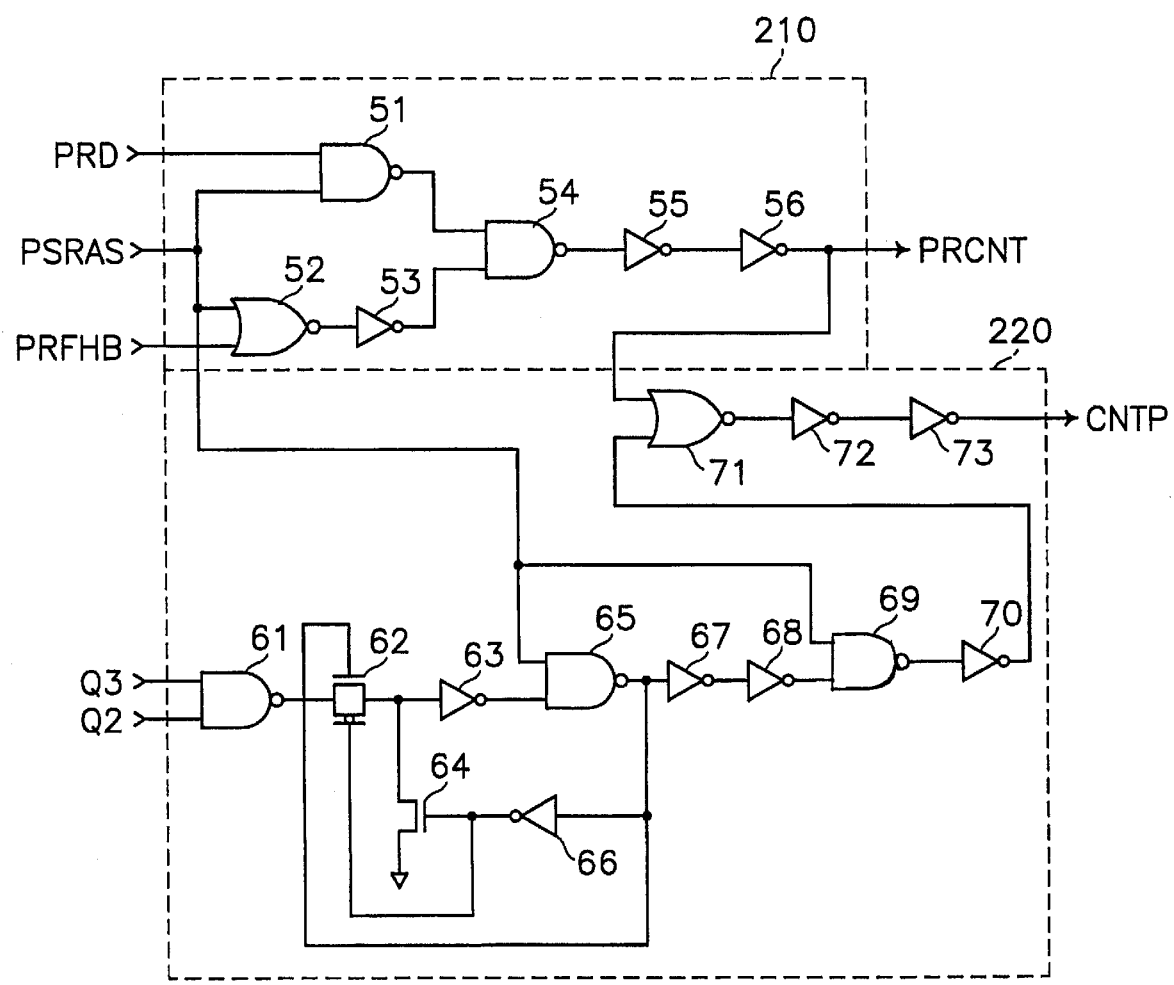
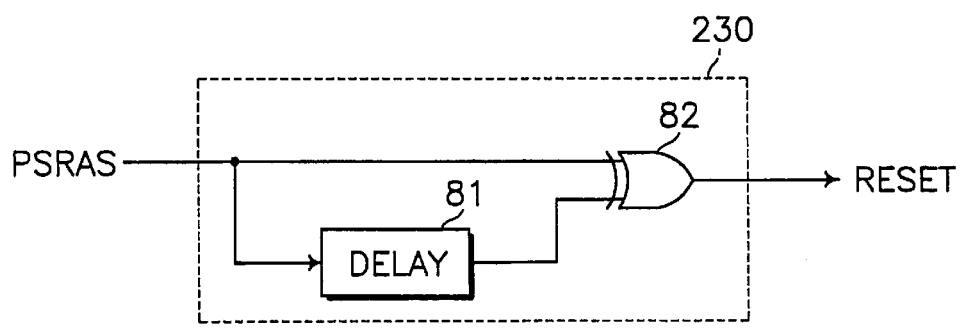

INTEGRATED CIRCUIT MEMORY DEVICES HAVING IMPROVED REFRESH MODE ADDRESSING AND METHODS OF OPERATING SAME

RELATED APPLICATION

This application is related to Korean Application No. 97-66535, filed Dec. 6, 1997, the disclosure of which is hereby incorporated herein by reference.

FIELD OF THE INVENTION

The present invention relates to integrated circuit devices, and more particularly to integrated circuit memory devices and methods of operating integrated circuit memory devices.

BACKGROUND OF THE INVENTION

Integrated circuit memory devices having volatile data storage may need to include refresh control circuits which refresh data stored in memory cells therein. For example, FIG. 1 illustrates a conventional integrated circuit memory device having refresh capability. In particular, FIG. 1 represents a dynamic random access memory (DRAM) device comprising an array 10 of memory cells which store data, a row address buffer 11 which buffers an m-bit row address, a column address buffer 12 which buffers an n-bit column address, a row address decoder 13 which selects word lines in the memory cell array 10 in response to the row address, a column address decoder 14 which selects columns of memory cells in the memory cell array 10 in response to the column address, a data input buffer 15 which receives data and a data output buffer 16 which supplies data to external devices. The DRAM device also includes a sense amplifier 17 connected to bit lines (not shown) of the memory cell array 10, an input/output gate circuit 18 for selectively connecting the bit lines of the memory cell array to data input and output buffers 15 and 16 in response to the outputs of the column decoder, and a chip control circuit 20 which receives a row address strobe signal (/RAS), a column address strobe signal (/CAS) and a write enable signal (/MWE).

Because the DRAM device provides volatile storage of data, a data refresh circuit 30 is provided for regulating refresh operations. During refresh operations, data signals stored in the memory cells are periodically amplified by the sense amplifier 17 and again rewritten into the memory cells. The refresh circuit 30 comprises a refresh timer 31 for generating the timing signals for the periodic refresh operation, a refresh control circuit 32 for controlling the operations associated with refreshing the memory device in response to the timing signals and a refresh address generator 33 for generating internal refresh addresses under the control of the refresh control circuit 32.

There are a couple of conventional techniques for refreshing data within DRAM cells. One technique is referred to as the /RAS-Only Refresh technique (i.e., ROR technique). In accordance with this technique, the refresh operations for the memory cells are performed by activating only the /RAS signal (/RAS=0) while a /CAS (Column Address Strobe) signal is maintained in a precharged level. Under the ROR mode, memory devices are adapted to receive refresh addresses from the exterior for the respective refresh operations, and address buses connected to the memory devices cannot be used for other purposes.

Another widely used technique is referred to as /CAS-before-/RAS refresh (i.e., CBR refresh). Here, when the memory cells are accessed during the period of normal operations, the externally supplied /RAS signal is activated prior to the /CAS signal. But, in order to recognize an entry into the CBR refresh mode, the /CAS signal should become active before the /RAS signal becomes active, as shown in FIG. 4. In other words, before the /RAS signal transitions from a high level to a low level, the /CAS signal transitions from a high level to a low level. Here, the refresh addresses are generated internally by the refresh address generator 33 installed in the DRAM, and external control for the refresh address generator 33 is typically not possible.

Most DRAMs are also provided with a self-refresh mode in order to reduce the amount of current consumed during the refresh operation. An initial cycle of the self-refresh mode is the same as that of the CBR refresh mode. However, in the event both /CAS and /RAS signals are active simultaneously during a predetermined period (for example, 100 $\mu$s), a self-refresh operation will be performed to read out data stored in all the memory cells, amplify the data and then restore the data. During this period of operation, normal operations such as read and write operations are interrupted. The refresh timer 31 and the refresh address generator 33 in the DRAM typically operate in response to an internal clock signal and not an external clock signal. However, because the refresh time period of the self-refresh mode is generally set to a longer period than those of different refresh modes (e.g., the self-refresh time period is set to 128 ms (or longer) while the CBR refresh time period is set to 16 ms), the current consumed during self-refresh may be lower than during another refresh period. Conventional integrated circuit memory devices which utilize refresh modes are also disclosed in U.S. Pat. Nos. 4,809,233, 4,939,695, 4,943,960 and 5,315,557.

The time period required for refreshing all the rows of a memory cell array is generally referred to as a refresh cycle time. For example, in a sixteen megabit DRAM having a cell array comprising 2048 rows×512 columns×16 bits, 2048 rows may be sequentially refreshed during the time interval 128 ms. In this case, the inter-cycle time interval (i.e., the refresh clock period) is approximately 62.5 $\mu$s (=128 ms/2048 rows). Thus, a refresh of one row of the array (which may take 80–200 ns) can be performed during each 62.5 $\mu$s time interval.

FIG. 2 illustrates a detailed configuration of the refresh address generator 33 and the row address buffer 11 of FIG. 1. Referring to FIG. 2, the refresh address generator 33 comprises m-bit binary ripple counter which comprises toggle flip-flops FF0–FFm−1 connected in series. The refresh address generator 33 generates m-bit refresh addresses C0–Cm−1. The flip-flop FF0 receives LSB control pulse signal CNTP from the refresh control circuit 32 and generates LSB address signal C0 and its complementary signal CT0. The next flip-flop FF1 receives the signal CT0 and generates the higher bit address signal C1 and its complementary signal CT1. Similarly, the remaining flip-flops FF2, FF3, . . . , and FFm−1 respectively receive the complementary address signals from the lower bit flip-flops and generate the corresponding bit address signals and their complementary address signals.

The refresh control circuit 32 controls the flip-flops FF0–FFm−1 by means of an address output control signal PRCNT so that m-bit refresh addresses C0–Cm−1 can be forwarded from the flip-flops FF0–FFm−1 to the row address buffer 11. The address bit signals C0-Cm−1 output from the flip-flops FF0–FFm−1 are respectively supplied to the corresponding buffers AB0–ABm−1 in the row address buffer 11.

In general, although a plurality of refresh modes implemented in a single DRAM have different refresh times (for example, 4–256 ms) respectively, all refresh modes are provided with identical refresh cycles. However, to provide memory devices which require less power, attempts have been made to reduce the self-refresh current by designing a cycle of the self-refresh mode to be shorter than that of other refresh modes (for example shorter than the CBR refresh mode).

FIG. 3 illustrates relations between the generated refresh address signals and the word lines selected by the address signals under the CBR refresh mode and the self-refresh mode in the event the numbers of cycles per refresh period in the CBR refresh mode and the self-refresh mode are respectively set at 2K and 1K. For convenience of explanation, as shown in FIG. 3, it is assumed that memory cell array 10 includes two memory banks BANK1 and BANK2, to which a total of 2×1024 rows and word lines are provided. To address these 2048 rows, a row address of eleven (11) bits is required. During a CBR refresh mode of a 2K cycle, as shown in the upper part of FIG. 3, the refresh address generator 33 generates internal refresh addresses 00h (=00000000000) through 7FFh (=11111111111) sequentially. By so doing, word lines WL0–WL2047 of the two memory banks BANK1 and BANK2 are sequentially selected. On the other hand, if a self-refresh mode of a 1K cycle is provided, as shown in the lower part of FIG. 3, the refresh address generator 33 will generate the addresses 000h (=00000000000) through 3FFh (=01111111111) sequentially to select each pair of word lines WL0 and WL1024, WL1 and WL1025, . . . , and WL1023 and WL2047 in order. That is, a pair of word lines are simultaneously selected per refresh cycle in the self-refresh mode.

However, if the refresh cycle during the self-refresh mode is smaller than that of the CBR refresh mode, then at least one row or word line will not be selected when (1) only the self-refresh operation is performed, (2) the self-refresh operation is performed after completion of at least one cycle of a CBR refresh operation, or (3) another self-refresh operation is performed after completion of the prior self-refresh operation and at least one cycle of a CBR refresh operation. This means that some memory cells may not be refreshed properly if any of the conditions (1)14 (3) occur.

To illustrate, it is assumed that the CBR refresh operation of a 2K cycle and the self-refresh operation of a 1K cycle are performed in series and the initial address of the refresh address generator 33 is set to 000h. As described above, in order to change the refresh mode in a certain semiconductor memory device into the self-refresh mode, it is necessary that at least one CBR refresh cycle be performed. That is, when the CBR refresh mode of operation has been initiated and thus the /CAS and /RAS signals are maintained at low levels during a predetermined time period ( e.g. 100 μs) or longer, the refresh mode of the memory device will switch to the self-refresh mode. Since the beginning cycle of the 1K self-refresh mode is the same as that of the 2K CBR refresh mode, the first word line WL0 of the memory block BANK1 shown in FIG. 3 is selected by means of the initial address 000h provided by the refresh address generator 33. Next, the successive self-refresh cycles will be performed and the refresh address generator 33 will generate the addresses 001h, 002h, . . . , 3FFh in sequence. Therefore, pairs of the word line WL1 and WL1025, WL2 and WL1026, . . . , and WL1023 and WL2047 will be selected in turn. As a result, the first word line WL1024 of BANK2 will not be selected during the 1K self-refresh term, but the word line WL1024 will be selected during the following self-refresh term.

As illustrated by FIG. 4, in the event one cycle of the 2K CBR refresh operation is performed and thereafter a 1K self refresh operation is performed, if WL0 of Bank 1 is selected in a 2K CBR cycle then WL1024 of Bank 2 will not be selected. Thereafter, upon entry into a self-refresh mode, WL1 of Bank 1 will be selected, but WL1025 of Bank 2 will not be selected. Next, WL2 in Bank 1 and WL1026 in Bank 2 will be selected, followed by WL3 and WL1027 and so on. Furthermore, as illustrated by FIG. 5, in the event one cycle of the 1K self refresh operation is performed, then one cycle of the 2K CBR refresh operation is performed and then another 1K self refresh operation is performed in sequence, then WL1021, WL1022 or WL2045, WL2046 will not be selected in the CBR and self-refresh entry cycles, respectively, if the self-refresh mode is exited at WL1020 has been selected.

Thus, notwithstanding the above-described integrated circuit memory devices, integrated circuit memory devices having improved refresh mode addressing are required so that rows of memory cells are not skipped when transitioning from one refresh mode to another refresh mode.

SUMMARY OF THE INVENTION

It is therefore an object of the present invention to provide improved integrated circuit memory devices and methods of operating same.

It is another object of the present invention to provide integrated circuit memory devices having improved refresh mode addressing and methods of operating same.

It is still a further object of the present invention to provide integrated circuit memory devices which are less susceptible to data corruption caused by refresh failures and methods of operating same.

These and other objects, advantages and features of the present invention are provided by integrated circuit memory devices which include an array of memory cells and means, coupled to the array, for generating first and second different sequences of addresses during first and second refresh modes, respectively, and repeating at least one of the addresses in the first sequence as an address in the second sequence when transitioning from the first refresh mode to the second refresh mode. Here, the means for generating first and second different sequences of addresses may comprise means for generating row addresses during the first and second refresh modes with the most significant bit of a row address being toggled with each consecutive row address during the first refresh mode.

According to a preferred aspect of the present invention, the first refresh mode is a CAS-before-RAS refresh mode, the second refresh mode is a self-refresh mode and the address in at least one of the first and second periods of the self-refresh mode is preferably equivalent to an address in the last period of a preceding CAS-before-RAS refresh mode when transitioning from the first refresh mode to the second refresh mode. The means for generating the first and second different sequences of addresses also preferably comprises a refresh address generator and a row address buffer electrically coupled to outputs of the refresh address generator.

According to another embodiment of the present invention, a preferred method of operating an integrated circuit memory device comprises the steps of generating a first sequence of row addresses during a first refresh mode and generating a second sequence of row addresses, different from the first sequence of row addresses, during a second refresh mode. At least one of the addresses in the first sequence of row addresses is also preferably repeated in the second sequence of row addresses when transitioning from the first refresh mode to the second refresh mode. The first two row addresses in the second sequence of row addresses may also be the same so that one or more rows of cells in the memory array is not missed during refresh operations.

BRIEF DESCRIPTION OF THE DRAWINGS

FIG. 7 is an electrical schematic of a preferred addressing mode controller of FIG. 6.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 6:
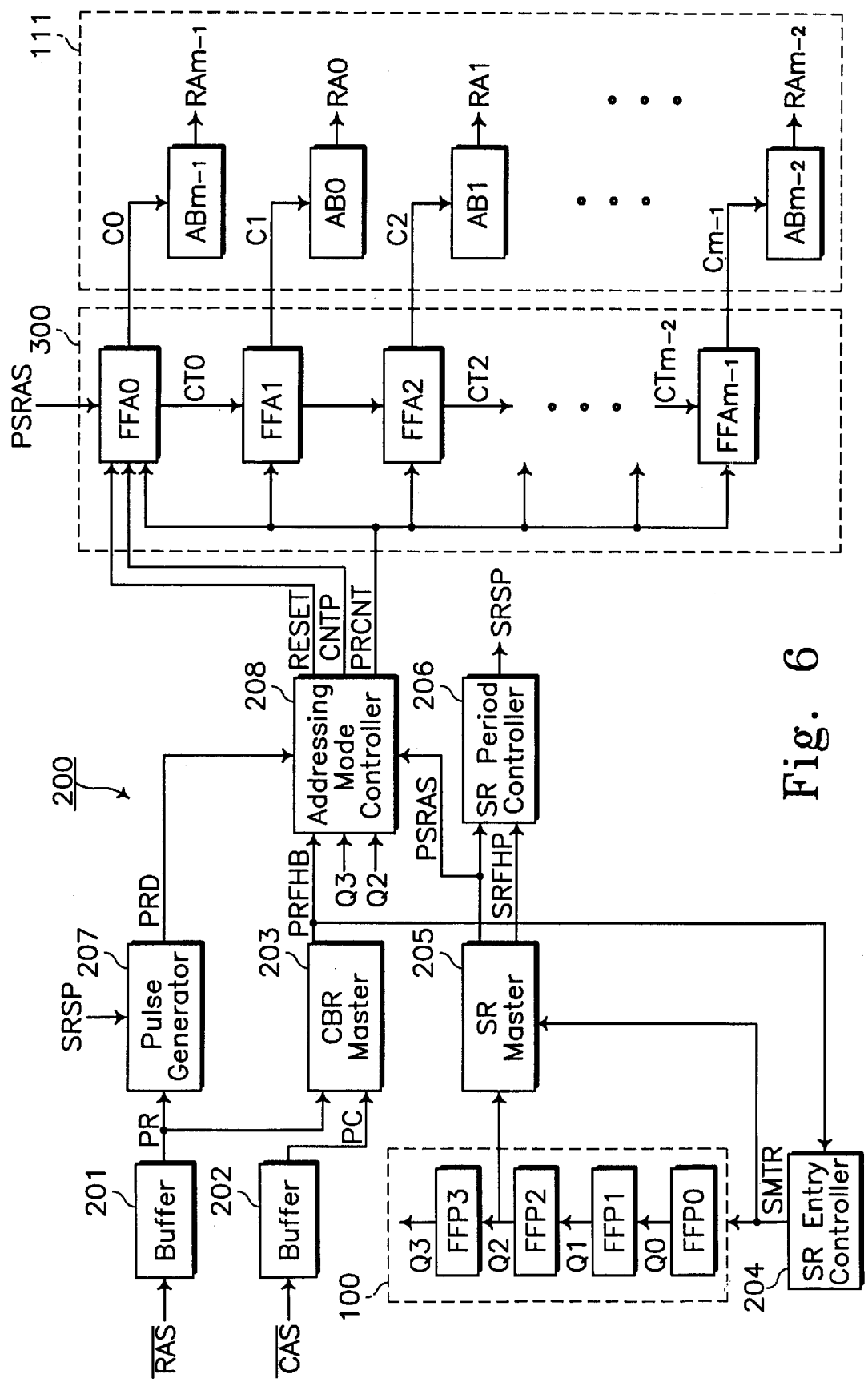
FIG. 6 is a block diagram of an integrated circuit memory device according to an embodiment of the present invention.

FIG. 6 illustrates a refresh circuit as an embodiment of the present invention. Referring to FIG. 6, a preferred semiconductor memory device includes a refresh circuit capable of generating refresh addresses in different incremental sequences and refreshing all the cells of the memory device under at least two refresh modes having different refresh cycles even though the respective refresh modes are sequentially performed. The refresh circuit comprises a self-refresh timer 100, a refresh control circuit 200 and a refresh address generator 300.

The self-refresh timer 100 can be constructed with binary counters and can be operated in response to a self mode entry control signal SMTR from the self-refresh control circuit 200. The timer 100 generates a self-refresh period pulse signal Q2 corresponding to a given self-refresh period. The refresh control circuit 200 comprises buffers 201 and 202 for receiving a RAS signal and a CAS signal, respectively, and a CBR master 203 for receiving outputs PR and PC of the buffers. The CBR master 203 generates a refresh enable signal PRFHB by detecting a CBR refresh mode. The control circuit 200 also comprises a self-refresh (SR) entry controller 204 for generating the self mode entry control signal SMTR to change the refresh mode of the semiconductor memory device from a CBR mode to a self-refresh mode when the refresh enable signal PRFHB from the CBR master 203 is activated during a predetermined time period. A self-refresh master 205 is also provided to generate signal SRFHP as a delayed version of the self-refresh period pulse signal Q2 and generate a self-refresh enable signal PSRAS. These signals are generated in response to the period pulse signal Q2 and the self mode entry control signal SMTR.

The refresh control circuit 200 further comprises a self-refresh period controller 206 for generating a self-refresh period control signal SRSP in response to the self-refresh enable signal PSRAS and signal SRFHP. A pulse generator 207 is also provided for generating a refresh driving pulse PRD in response to the output signal PR of the RAS buffer 201 and the self-refresh period control signal SRSP. In addition, an addressing mode controller 208 is provided for generating a refresh address appropriate to the CBR refresh mode or the self-refresh mode. The controller 208 is responsive to the self-refresh period pulse signal Q2 of the self-refresh timer 100, a one half frequency-divided signal Q3 of the self-refresh period pulse signal Q2, the refresh enable signal PRFHB from the CBR master 203, the self-refresh enable signal PSRAS from the self-refresh master 205 and the refresh driving pulse PRD from the pulse generator 207.

The refresh address generator 300 includes an m-bit binary ripple counter which may be formed from a plurality of toggle flip flops FFA0-FFAm−1. The refresh address generator 300 generates an m-bit refresh address C0–Cm−1. As illustrated, the flip flop FFA0 of the least significant bit receives LSB control pulse signal CNTP from the refresh control circuit 200 and generates the least significant bit address signal C0 and its complementary signal CT0. The flip flop FFA1 of the neighboring next upper bit receives the signal CT0 and generates the corresponding address signal C1 and its complementary signal CT1. In the same manner, the remaining flip flops FFA2, FFA3, . . . , and FFAm−1 respectively receive the complementary signals of the address signals from the flip flops of the neighboring lower bits and generate the corresponding address signals and their complementary signals. The outputs C0, C1, C2, . . . , and Cm−1 of the flip flops FFA0–FFAm−1 are respectively supplied to buffers ABm−1, AB0, AB1, . . . , and ABm−2 in the address buffer circuit 111. Thus, in the preferred refresh address generator 300, the flip flop FFA0 of the least significant bit is connected to buffer ABm−1 of the most significant bit in the row address buffer circuit 111, and the flip flop FFA1 of the neighboring next upper bit is connected to buffer AB0 of the least significant bit in the row address buffer circuit 111. The remaining flip flops FFA2–FFAm−1 are respectively connected to the remaining buffers AB1–ABm−2, as illustrated.

Figure 1:
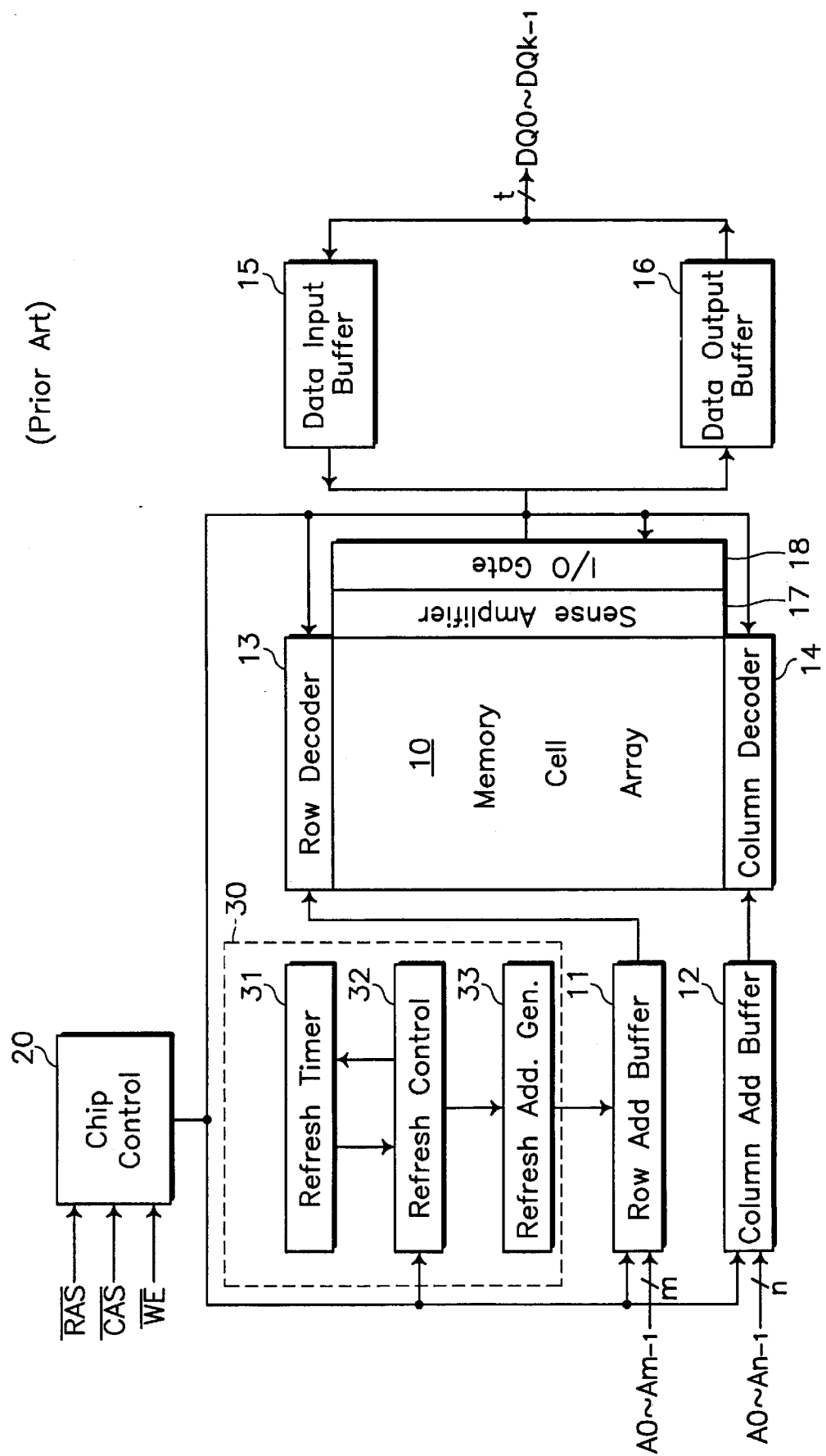
FIG. 1 is a block diagram of a conventional integrated circuit memory device.
Figure 2:
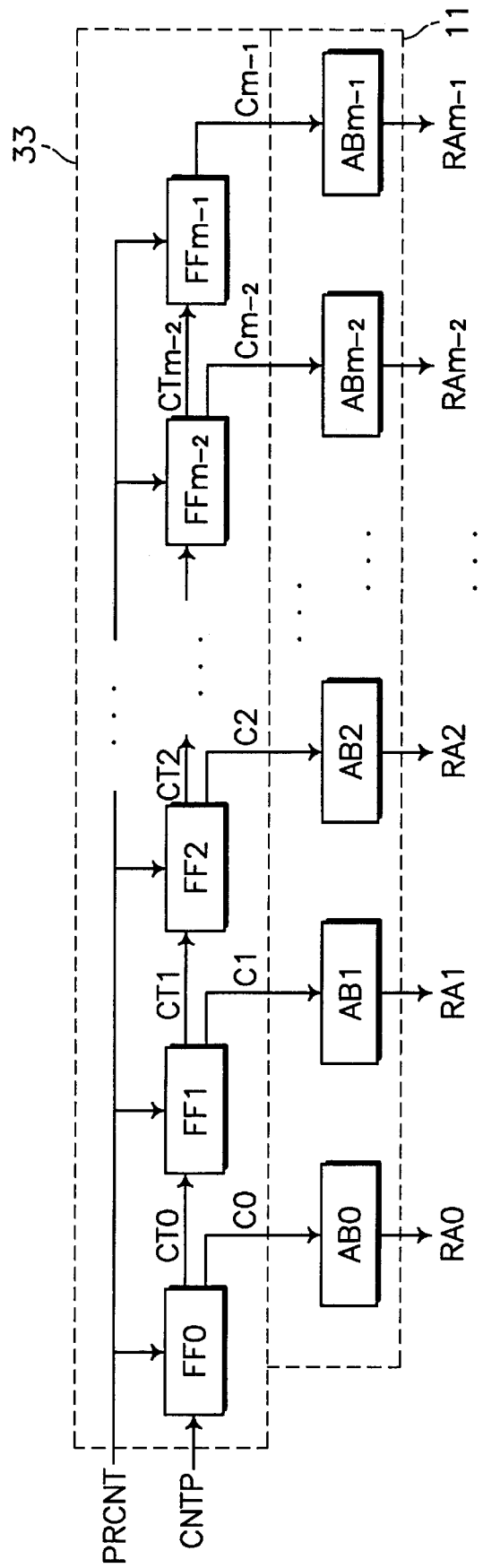
FIG. 2 is a block diagram of a refresh address generator and a row address buffer according to the prior art.

The supply of m-bit refresh addresses C0–Cm−1 from the flip flops FFA0–FFAm−1 to the row address buffer circuit 111 is controlled by the address output control signal PRCNT. However, in contrast to the refresh address generator 33 of FIG. 2, the bit address signals C0, C1, . . . , and Cm−1 outputted from the flip flops FFA0–FFAm−1 are supplied to the corresponding buffers ABm−1, AB0, . . . , and ABm−2 in the row address buffer circuit 111. The row address buffer circuit 111 supplies m-bit row address RA0–RAm-1 and thereby enables a predetermined word line to be selected during refresh operations.

FIG. 7 illustrates a detailed electrical schematic of the addressing mode controller 208 of FIG. 6. Referring to FIG. 7, the addressing mode controller 208 includes a first circuit 210 for receiving the refresh driving pulse PRD, the self-refresh enable signal PSRAS and the refresh enable signal PRFHB and generating the address output control signal PRCNT. The first circuit 210 comprises NAND gates 51 and 54, NOR gate 52, and inverters 53, 55 and 56 connected as illustrated. The addressing mode controller 208 further includes a second circuit 220 for receiving the outputs Q2 and Q3 of the self-refresh timer 100 and generating the LSB control pulse signal CNTP. The second circuit 220 comprises NAND gates 61 and 65, a transfer gate 62, a pull-down transistor 64, inverters 63, 66, 67, 68, 70, 72 and 73, NAND gate 69 and NOR gate 71. The addressing mode controller 208 also includes a third circuit 230 for generating a reset signal RESET in response to the self-refresh enable signal PSRAS. The third circuit 230 comprises a delay circuit 81 and an exclusive-OR gate 82. The operation of these circuits 210, 220 and 230 will now be described in more detail.

Figure 8:
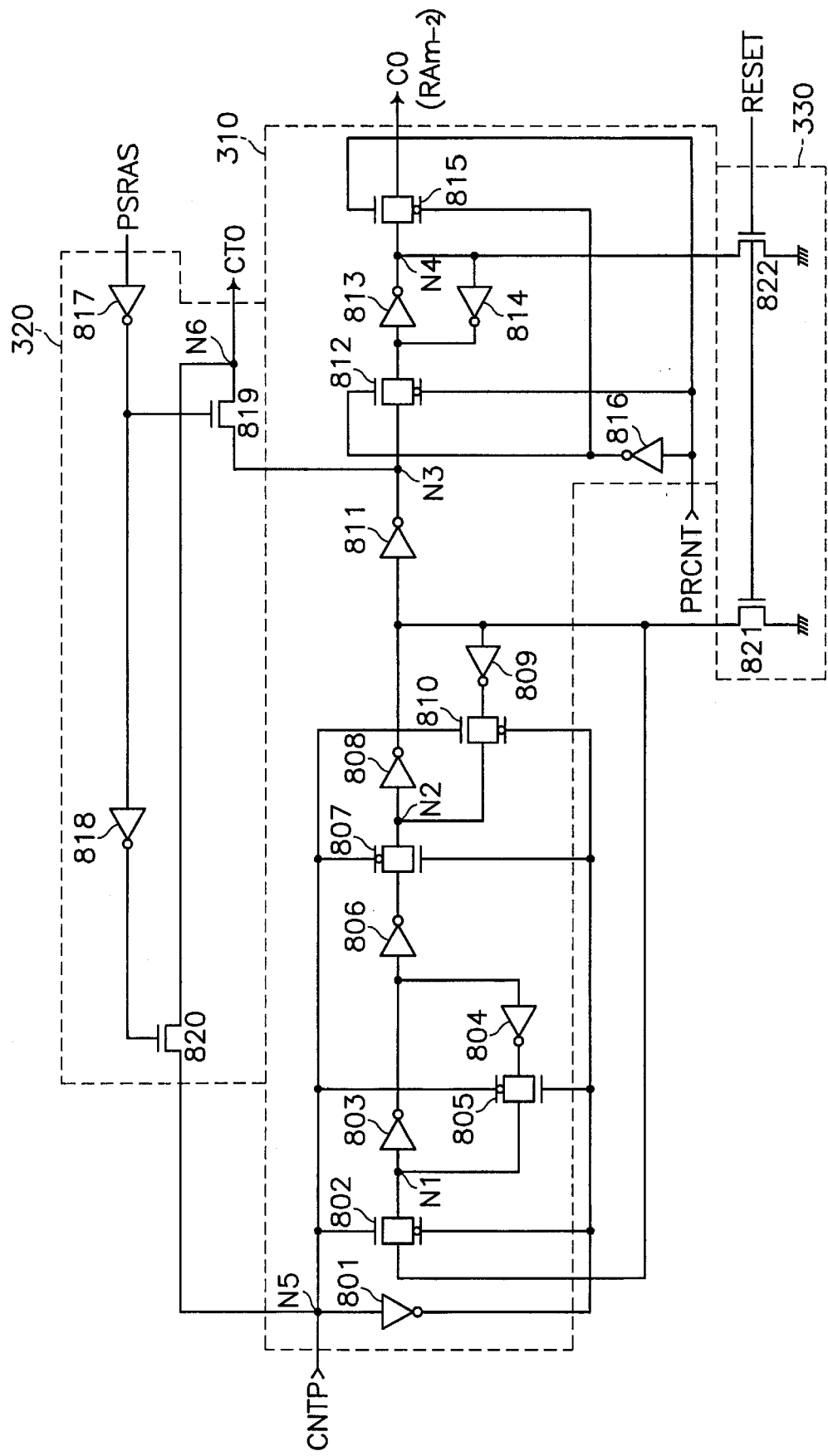
FIG. 8 is an electrical schematic of a preferred flip-flop FFA0 illustrated by FIG. 6.

FIG. 8 is a detailed circuit diagram of the flip flop FFA0 of the least significant bit in the refresh address generator 300 shown in FIG. 6. In the drawing, the flip flop FFA0 includes a master-slave toggle flip flop circuit 310, a switch circuit 320, and a reset circuit 330. The flip flop circuit 310 comprises inverters 801, 803, 804, 806, 808, 809, 811, 813, 814 and 816, and transfer gates 802, 805, 807, 810, 812 and 815. The switch circuit 320 comprises inverters 817 and 818, and transistors 819 and 820. The reset circuit 330 comprises transistors 821 and 822.

In the master-slave toggle flip flop circuit 310 of the flip flop FFA0, when the LSB control pulse signal CNTP is in a high level or a logic 1 state, transfer gates 802 and 810 are open to toggle the signal (referred to S_N1) on the node N1 and at the same time the inverters 808 and 809 latch the signal (referred to S_N2) on the node N2. On the other hand, when the pulse signal CNTP is in a low level or a logic 0 state, transfer gates 805 and 807 are open to enable the inverters 803 and 804 to latch the signal S_N1 and at the same time the signal S_N1 is transferred to the node N3 through the node N2. Further, when the address output control signal PRCNT is in low level, transfer gate 812 is open so that the signal at node N3 is inverted and latched at the node N4. But, when the address output control signal PRCNT is in high level, transfer gate 815 is open so that the signal (referred to S_N4) is output as the least significant bit signal C0 of the refresh address. The signal C0 is supplied to the buffer ABm-1 of the most significant bit in the row address buffer circuit 111.

In the switch circuit 320, when the self-refresh enable signal PSRAS is at a low level, the transistor 819 is turned on. Thus, the signal S_N3 on the node N3 is outputted as the signal CT0 via the node N6. On the other hand, when the self-refresh enable signal PSRAS is at a high level, the transistor 819 is turned off and the transistor 820 is turned on. When this occurs, the LSB control pulse signal CNTP passed from node N5 to node N6 as the signal CT0. As illustrated by FIG. 6, the signal CT0 is transferred to the flip flop FFA1 of the next bit.

In the reset circuit 330, when the reset signal RESET is supplied by the control circuit 230 (in the addressing mode controller 208) at a high level, the transistors 821 and 822 are turned on. When this occurs, the signal S_N2 on the node N2 and the signal S_N4 on the node N4 are respectively reset to the high level and the low level. These reset operations are necessary for exiting from the self-refresh mode.

Figure 9:
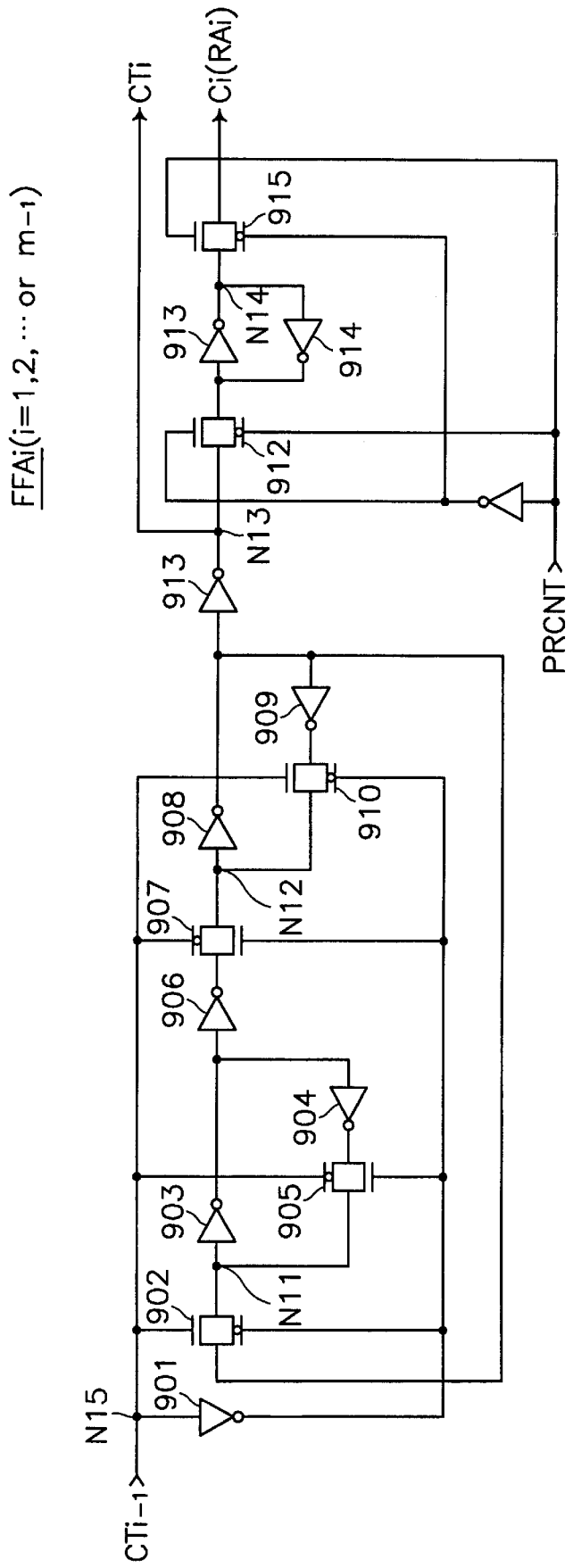
FIG. 9 is an electrical schematic of preferred flip-flops FFA1–FFAm−1 illustrated by FIG. 6.

FIG. 9 is a detailed electrical schematic of the respective flip flops FFA1, FFA2, . . . , and FFAm-1 in the refresh address generator 300 of FIG. 6. As illustrated, the flip flops FFA1, FFA2, . . . , and FFAm-1 comprise master-slave toggle flip flops. The input node N15 of each flip flop FFAi (herein, i=1,2, . . . , or m-1) is supplied with the output signal CTi-1 of the flip flop FFAi-1 of the neighboring lower bit. For example, the input node N15 of the flip flop FFA1 is supplied with the output CT0 of the flip flop FFA0.

In the flip flop FFA1, when the output signal CTi-1 of the neighboring lower bit is set to a high level, transfer gates 902 and 910 are open to toggle the signal S_N11 on the node N11 and at the same time the signal S_N12 on node N12 is latched by the inverters 908 and 909. On the other hand, when the signal CTi-1 is set to a low level, transfer gates 905 and 907 are open so that the signal S_N11 is latched by the inverters 903 and 904 and at the same time transferred to the node N13 via the node N12.

Furthermore, when the address output control signal PRCNT is set to a low level, transfer gate 912 is open and the signal S_N13 is inverted and latched at node N14. But, transfer gate 915 will be closed so that the signal S_N13 is not transferred to the corresponding address buffer ABi-1 in the row address buffer circuit 111. On the other hand, when the address output control signal PRCNT is set to a high level, transfer gate 915 is opened so that the signal S_N13 on the node N14 is transferred to the corresponding buffer ABi-1.

Figure 3:
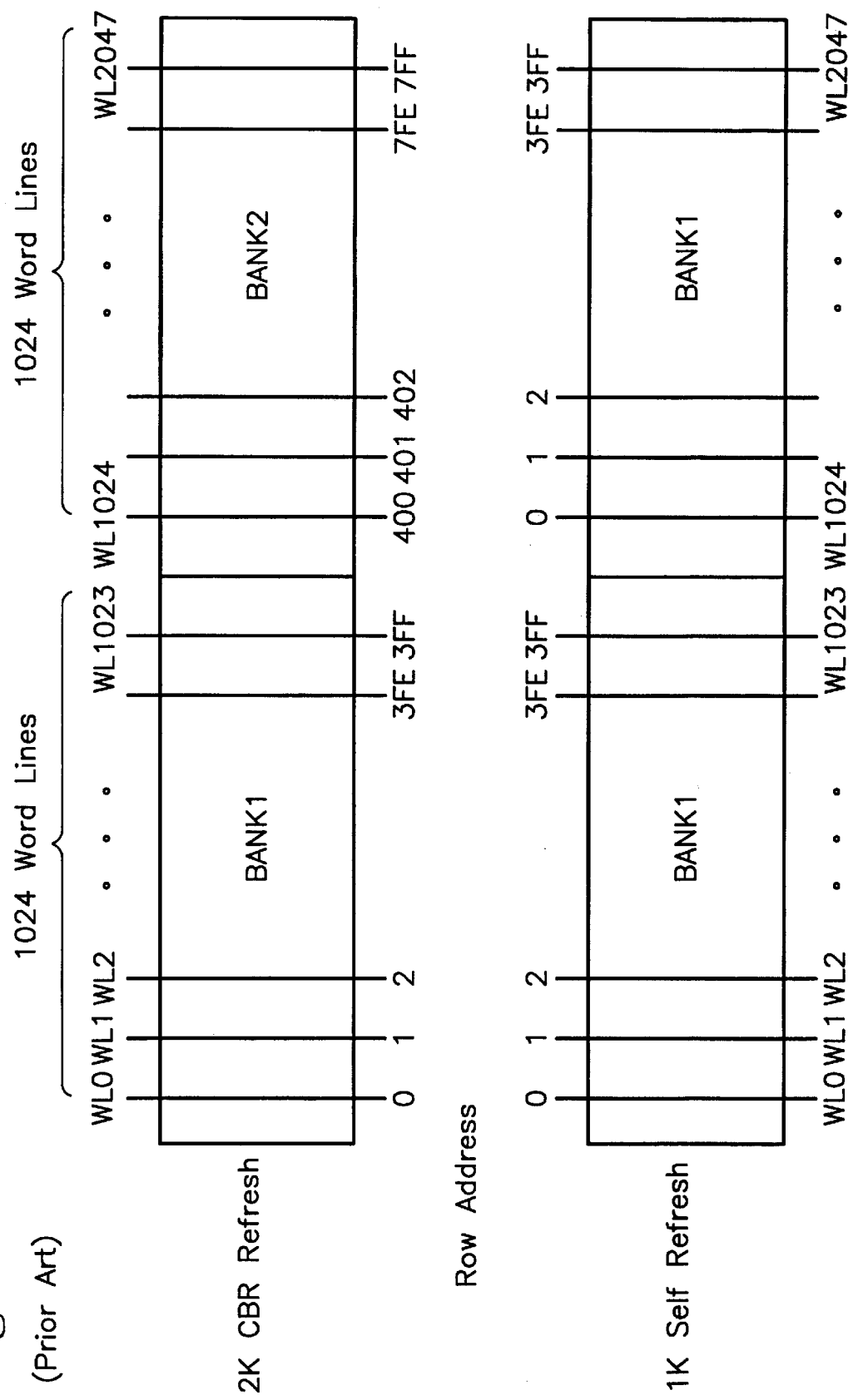
FIG. 3 is a block diagram of a multi-bank memory device according to the prior art.
Figure 10:
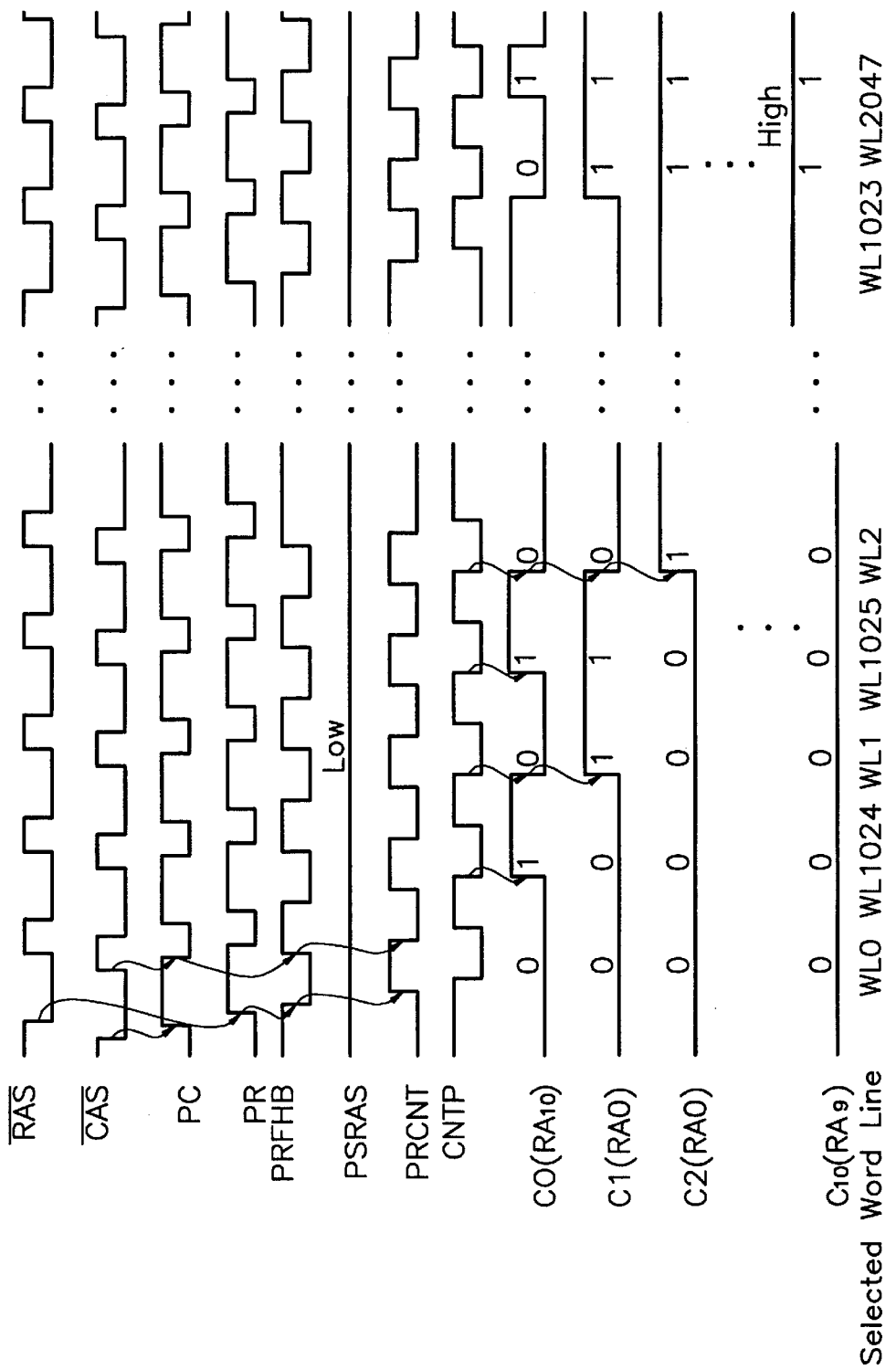
FIG. 10 is a timing diagram which illustrates a CBR refresh mode in accordance with the present invention.
Figure 11:
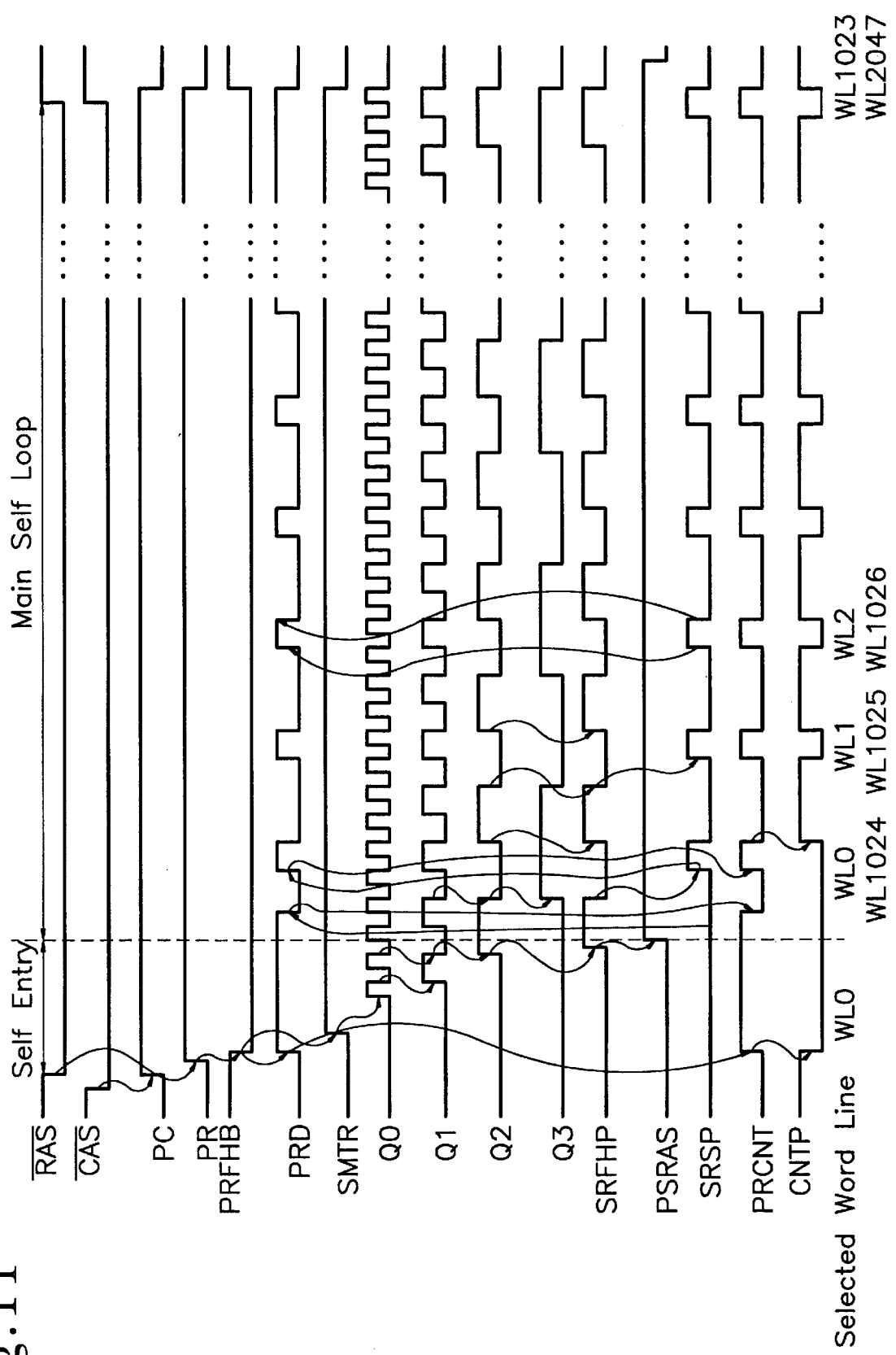
FIG. 11 is a timing diagram which illustrates a self-refresh mode in accordance with the present invention.
Figure 12:
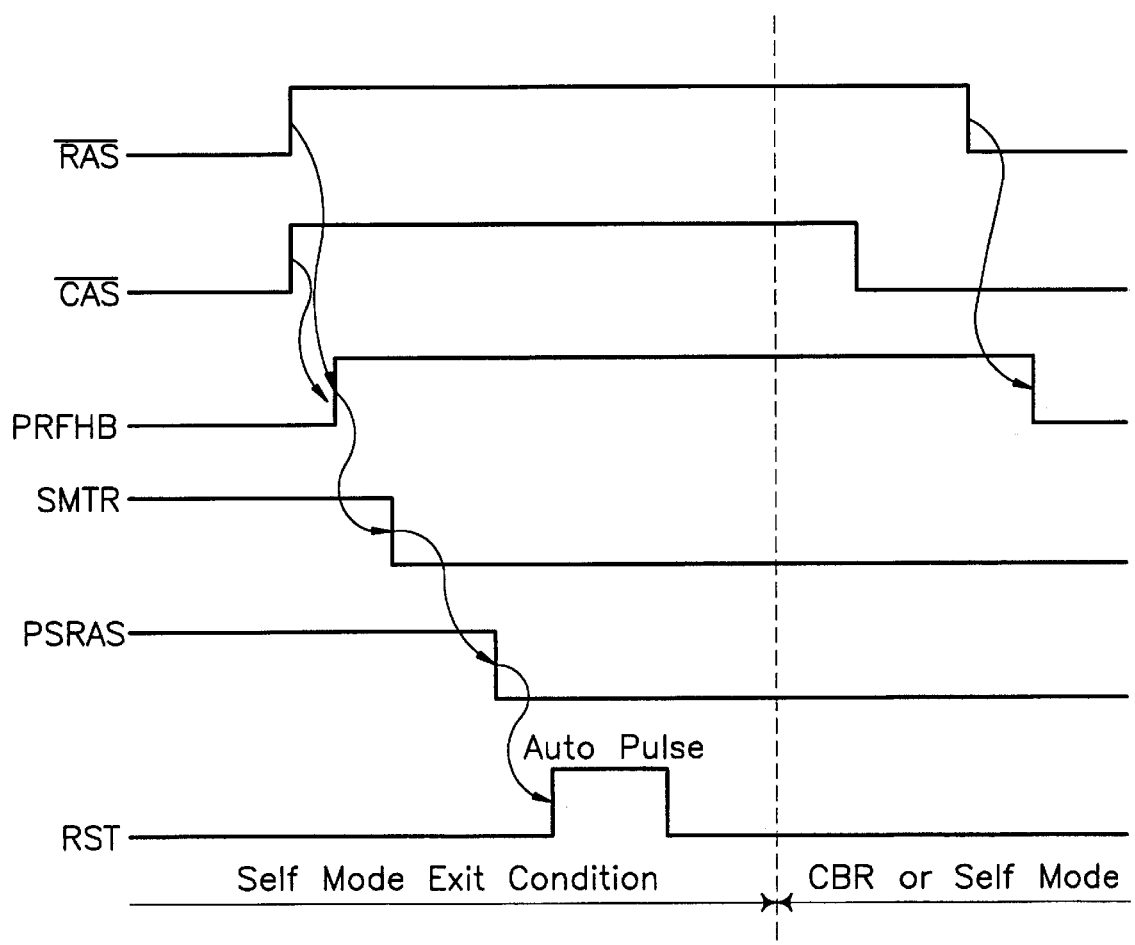
FIG. 12 is a timing diagram which illustrates completion of the self-refresh mode illustrated by FIG. 11.

Referring now to FIGS. 10–12, preferred operations will now be described for controlling the multi-bank memory device of FIG. 3 using the circuits of FIGS. 6–9. FIG. 10 is a timing chart for illustrating schematically the 2K CBR refresh operation using the refresh circuit of FIG. 6 under the above mentioned conditions. For purposes of illustration herein, it is assumed that nodes N1–N3 of FIG. 8 and nodes N11–N13 of FIG. 9 are preset to logic 1 levels. First, during the period in which the /CAS and /RAS signals are maintained at a high level, the refresh enable signal PRFHB and the LSB control pulse signal CNTP are maintained at a high level while the self-refresh enable signal PSRAS and the address output control signal PRCNT are maintained at a low level. During this time, the switch circuit 320 connects the node N3 electrically to the node N6 because the self-refresh enable signal PSRAS is at a low level. Therefore, the signal S_N3 which is at a high level is output via the node N6 as the signal CT0. And, in response to the address output control signal PRCNT at a low level, the transfer gate 812 is opened so that the complement of signal S_N3 is latched onto the node N4. But, because the transfer gate 815 is in the closed state (i.e., blocking state), the low level signal S_N4 at node N4 is not supplied to the address buffer AB10. Further, because the LSB control pulse signal CNTP is at a high level, transfer gates 802 and 810 are open and transfer gates 805 and 807 are closed. As a result, the signal S_N1 of the node N1 is toggled and switched to a low level and the signal S_N2 of the node N2 is at a high level and is latched by the inverters 808 and 809.

Next, when the CAS signal is activated before the RAS signal, the refresh enable signal PRFHB transitions to a low level. At this time, as the refresh enable signal PSRAS is still maintained at a low level, the nodes N3 and N6 are electrically connected together by the switch circuit 320. Also, the control circuit 210 in the addressing mode controller 208 of FIG. 7 supplies the address output control signal PRCNT at a high level to the refresh address generator 300. Thus, transfer gate 812 is closed and transfer gate 815 is open so that the signal S_N4 on the node N4 is provided as a low level signal C0 to the buffer AB10 of the most significant bit in the row address buffer circuit 11.

Also, as the output of the NAND gate 65 in the control circuit 220 in FIG. 7 is at a high level, the output of the NOR gate 71 transitions to a low level. Therefore, the control circuit 220 supplies the LSB control pulse signal CNTP at a low level. As a result, transfer gates 801 and 810 are closed and transfer gates 805 and 807 are opened so that the signal S_N1 on the node N1 is latched by the inverters 803 and 804 and at the same time transferred to the nodes N3 and N6. The remaining flip flops FFA1, FFA2, . . . , and FFA10 are operated in a similar manner as FFA0, however, the flip flops FFA1, FFA2, . . . , and FFA10 are operative in response to the output Ci–1 of their respective neighboring lower bit (herein i=1,2, . . . , or 10), instead of the LSB control pulse signal CNTP.

Accordingly, as illustrated by FIG. 10, in the 2K CBR mode, the refresh address generator 300 generates the refresh addresses 000h, 400h, 001h, 401h, . . . , 3FFh, and 7FFh in turn. This means the word lines WL0, WL1024, WL1, WL1025, WL2, WL1026, . . . , WL1023, and WL2047 can be selected in alternating sequence during 2K CBR refresh. This advantage is achieved because the output C0 of the flip flop FFA0 is provided to the address buffer AB10 of the most significant bit.

FIG. 11 is a timing chart for illustrating the 1K self-refresh operation performed by the refresh circuit of FIG. 6. Referring to FIGS. 6–9 and FIG. 11, the operation of the preferred refresh circuit in the refresh mode according to an embodiment of the present invention will be described. Here, again we assume that nodes N1–N3 and N1–N13 of the respective flip flops are preset to high levels. Ten bit row addresses RA0–RA9 are also required for 1K self-refresh operation.

Referring now to FIG. 11, during the period in which the /CAS and /RAS signals are maintained at a high level, the refresh enable signal PRFHB and the LSB control pulse signal CNTP are maintained at a high level as well, but the refresh driving pulse signal PRD, the self mode entry control signal SMTR, the self-refresh enable signal PSRAS, the self-refresh period control signal SRSP and the address output control signal PRCNT are maintained at a low level. At this time, the switch circuit 320 of FIG. 8, like in the CBR mode, electrically connects the node N3 with the node N6 in response to the self-refresh enable signal PSRAS. Thus, the signal S_N3 is outputted at a high level via the node N6 as the signal CT0. Also, in response to the address output control signal PRCNT at a low level, the transfer gate 812 is opened to latch the complement of the signal at node N3 onto node N4. But, because transfer gate 815 is closed, the signal S_N4 at a low level is not supplied to the address buffer AB10. Further, since the LSB control pulse signal CNTP is at a high level, transfer gates 802 and 810 are open and transfer gates 805 and 807 are closed so that the signal S_N1 at node N1 is transitioned to a low level and at the same time the signal S_N2 at a high level on the node N2 is latched by the inverters 808 and 809.

Successively, when the CAS signal is activated before the RAS signal, the refresh enable signal PRFHB transitions to a low level like in the CBR refresh mode. At this time, the self-refresh enable signal PSRAS is still maintained at a low level, but the refresh driving pulse signal PRD and the address output control signal PRCNT are transitioned to high levels. Therefore, transfer gate 812 is closed and transfer gate 815 is opened so that the signal S_N4 (i.e. C0) at a low level on the node N4 is supplied to the buffer AB10 as the most significant bit in the row address buffer circuit 11. Because all the outputs CT1–CT10 of the flip flops FFA1–FFA10 are maintained in a low level, the refresh address generator 300 generates the row address 000h to select the word line WL0.

If a predetermined time (for example 100 μs) is lapsed thereafter, the self-refresh entry controller 204 generates the self mode entry control signal SMTR at a high level. When the refresh timer 100 begins to operate in response to the signal SMTR, entry into the self-refresh mode is accomplished.

The refresh timer 100, as described above, generates the self-refresh period pulse signal Q2 at a predetermined frequency and Q3 as its one-half frequency division signal. Based on this configuration, the self-refresh master 205 generates the delayed signal SRFHP of the self-refresh period pulse signal Q2 and the self-refresh enable signal PSRAS at a high level in response to the self-refresh period pulse signal Q2. These operations commence the self-refresh mode. Also, the switch circuit 320 of FIG. 8 connects the node NS directly to node N6 in response to a logic 1 self-refresh enable signal PSRAS. Thus, the LSB control pulse signal CNTP is supplied to the flip flop FFA1 corresponding to the LSB buffer AB0 and also the refresh address signal C0 at a low level is supplied from the flip flop FFA0 to the MSB buffer AB10. In addition, as the outputs CT1–CT10 of all the remaining flip flops FFA1–FFA10 are still maintained at a low level, the refresh address generator 300 generates the row address 000h to select the word line WL0. During the beginning cycle of the main self-refresh mode, the word line which has been selected in the self-refresh mode entry cycle (i.e. the last beginning cycle of the CBR mode) is selected once again. In other words, during this period, the refresh address generator 300 regenerates the address of the self-refresh entry cycle. The beginning address may be generated at least twice or more during a predetermined self-refresh time period.

However, up until this point, the output signal SRSP of the self-refresh period controller 206 is still maintained at a low level. This causes the refresh driving pulse signal PRD to transition to a low level. As a result, referring to FIG. 7 again, the address output control signal PRCNT which is output from the control circuit 210 (within the addressing mode controller 208) transitions down to the low level. Thus, transfer gate 812 is opened and transfer gate 815 is closed so that the signal S_N3 of a low level at node N3 is transferred to node N4. However, even though the self-refresh period pulse signal Q2 is at a high level, the output signal of the control circuit 220 (i.e. the LSB control pulse signal CNTP) is still maintained at a low level because the frequency division signal Q3 and the address output control signal PRCNT are at a low level. Thus, transfer gates 802 and 810 are closed and transfer gates 805 and 807 are opened so that the signal S_N1 at node N1 is latched by the inverters 803 and 804 and is also forwarded to node N3.

Thereafter, the self-refresh period controller 206 generates a pulse signal SRSP having a predetermined width in response to the falling edge of the output signal SRFHP of the self-refresh master 205. The pulse generator 207 generates the driving pulse PRD in synchronization with and in response to the pulse signal SRSP. In response to the driving pulse PRD, the circuit 210 of the addressing mode controller 208 generates the address output control signal PRCNT having the same pulse shape as that of the driving pulse PRD. Moreover, the control circuit 220 generates the LSB control pulse signal CNTP having the same pulse shape as that of the complement of the address output control signal PRCNT by the NOR gate 71 and the inverters 72 and 73. The remaining flip flops FFA1, FFA2, . . . , and FFA10 would be operated in the same manner as the above-mentioned operations except that the respective flip flops FFA1, FFA2, . . . , and FFA10 are operative in response to the output Ci–1 of their neighboring lower bit (where i=1,2, . . . , or 10) instead of the LSB control pulse signal CNTP.

Figure 4:
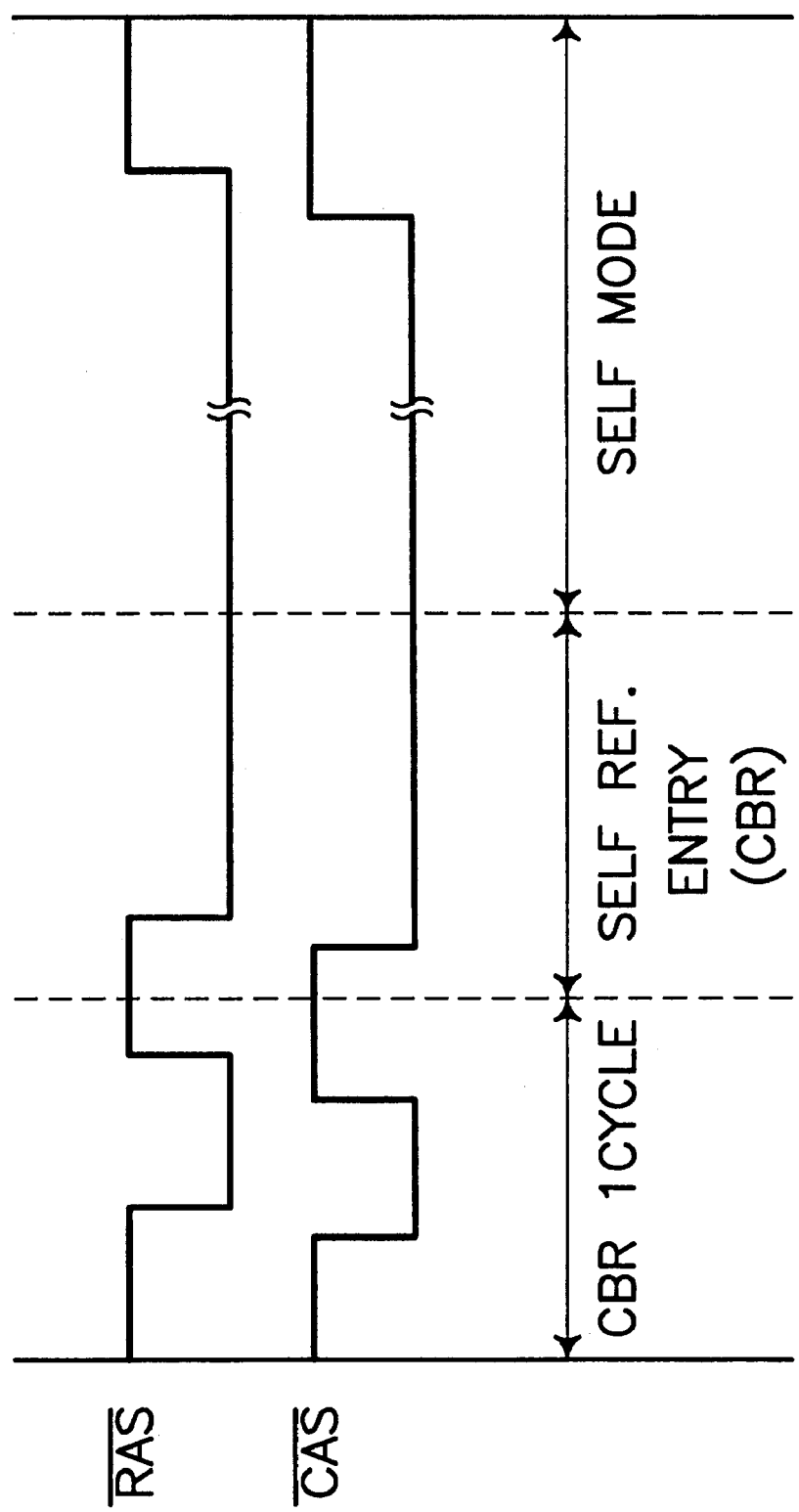
FIG. 4 is a timing diagram which illustrates a conventional method of entry into a self-refresh mode from a CBR refresh mode.
Figure 5:
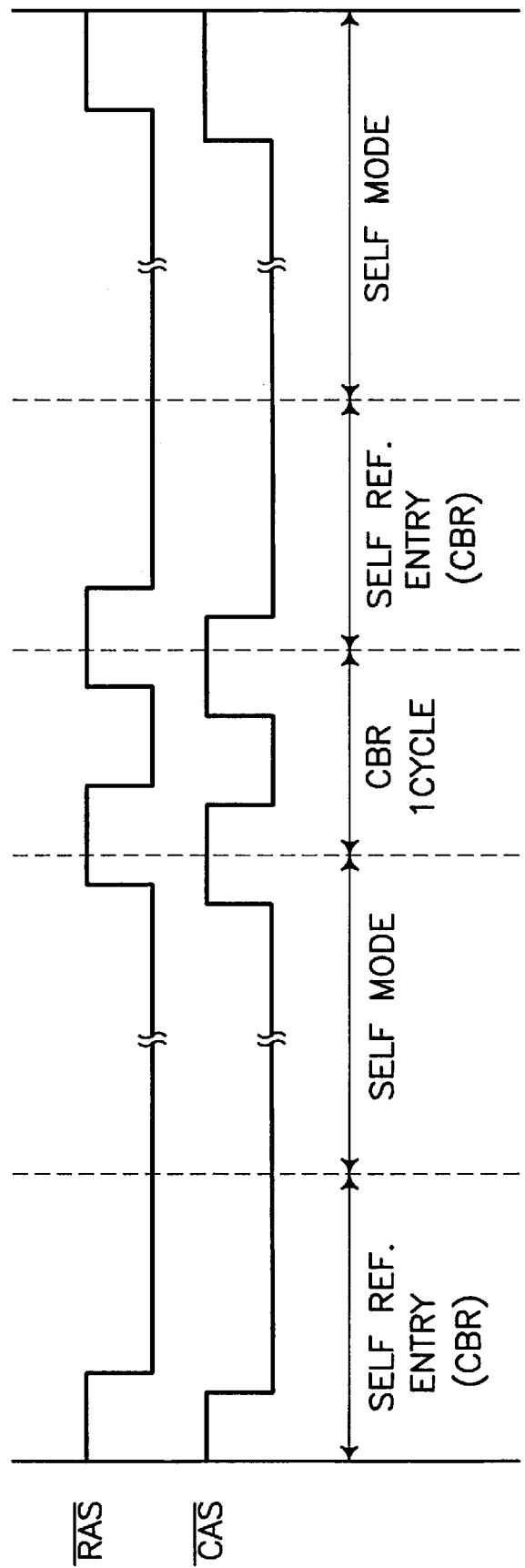
FIG. 5 is a timing diagram which illustrates a conventional method of transitioning from a self-refresh mode to a CBR refresh mode back to a self-refresh mode.

Finally, in the 1K self-refresh mode, the refresh address generator 300 generates the refresh addresses 000h during the self entry cycle, and generates 000h again at the beginning cycle of the main self-refresh cycle. Thereafter, addresses 001h, 002h, 003h, . . . , 3FEh are generated in sequence. Accordingly, as illustrated in FIG. 11, after the word line WL0 is initially selected in the self entry cycle, the word line pairs (WL0, WL1024), (WL1, WL1025), (WL2, WL1026), . . . , and (WL1023, WL2047) are selected in sequence. This means that after at least one cycle of the CBR mode has been accomplished, the address for entering the self-refresh mode can be generated again as the first address in the main self-refresh loop. Thus, in contrast to the self-refresh modes illustrated by FIGS. 4–5, no rows of memory cells are skipped during refresh operations.

Referring now to FIG. 12, operations for exiting from a self-refresh mode will be described. In particular, when the /CAS and /RAS signals are changed to high levels, the refresh enable signal PRFHB, the self mode entry control signal SMTR and the self-refresh enable signal PSRAS are inactivated in sequence. Thus, the control circuit 230 of FIG. 7 generates the reset signal RESET. As a result, transistors 821 and 822 in reset circuit 330 of the flip flop FFA0 are turned on to reset the nodes N3 and N4 to a high level and a low level respectively.

Thereafter, when the /CAS signal is activated before the /RAS signal (to enter into the CBR mode), the signal C0 at a low level on node N4 is provided to the buffer AB10 of the most significant bit in the row address buffer circuit 11. Therefore, assuming that the address of the last cycle in the self-refresh mode is 3FDh, the refresh address generator 300 will generate 3FEh rather than the row address 7FEh in the first cycle of the following CBR mode. In the following CBR mode, the address generator 300 would generate the addresses 7FEh, 3FEh, 7FFh, 000h, 400h, 001h, . . . , 7FDh and 3FDh sequentially in the same manner as the above-mentioned. Thus, even though a plurality of refresh modes having different refresh cycles are performed in a single semiconductor memory device, all the cells of the memory devices can be refreshed in the corresponding modes. Thus, the application of the refresh circuit according to the present invention to the semiconductor memory devices can reduce the power consumption of the memory devices.

To illustrate, the following examples are provided for a memory device having a plurality of memory banks BANK1 and BANK2 with 1024 word lines allocated for each bank.

EXAMPLE 1

During a CBR refresh mode, the following sequence of addresses will be generated during refresh: 000h, 400h, 001h, 401h, 002h, 402h, . . . , 3FFh, 7FFh. Alternatively, starting at an address of 2FDh, the following sequence of addresses would be generated: 2FDh, 6FDh, 2FEh, 6FEh, 2FFh, 6FFh, 300h, 700h, 301h, 701h, . . . , 3FFh, 7FFh, 000h, 400h, . . . , 2FCh, 6FCh.

EXAMPLE 2

During a self-refresh mode, the following sequence of addresses will be generated during refresh: 00h (self entry cycle), 000h, 001h, 002h, . . . , 3FFh. Alternatively, starting at an address of 200h (self entry cycle), the following sequence of addresses would be generated: 200h (self entry cycle), 200h, 201h, 202h, . . . , 3FFh, 000h, 001h, . . . , 1FFh.

EXAMPLE 3

During a self-refresh mode which commences after completion of one CBR cycle, the following sequence of addresses will be generated: 000h (1 CBR cycle), 400h (self entry cycle), 000h, 001h, 002h, . . . , 3FFh. A second example: 2FFh (1 CBR cycle), 6FFh (self entry cycle), 2FFh, 300h, 301h, 302h, . . .

EXAMPLE 4

During a second self-refresh mode which commences after completion of a first self-refresh mode and one cycle of a CBR refresh mode, the following sequence of addresses will be generated: 000h (self entry cycle), 000h, 001h, 002h, . . . , 3FFh, 000h (1 CBR cycle), 400h (self entry cycle), 000h, 001h, 002h, . . . , 3FFh. A second example: 3FEh (self entry cycle), 3FEh, 3FFh, 000h, 001h, . . . , 3FEh, 3FFh (1 CBR cycle), 7FFh (self entry cycle), 3FFh, 000h, 001h, . . .

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   an array of memory cells; and
   means, electrically coupled to said array of memory cells, for generating first and second different sequences of addresses during first and second data refresh modes, respectively, and for repeating at least one of the addresses in the first sequence as an address in the second sequence when transitioning from the first data refresh mode to the second data refresh mode.

2. The memory device of claim 1, wherein the second data refresh mode comprises a self-refresh mode; wherein the second sequence of addresses includes a plurality of addresses; and wherein the first two addresses in the second sequence of addresses are the same.

3. The memory device of claim 1, wherein the first and second different sequences of addresses are first and second different sequences of row addresses; and wherein a most significant bit of a row address is toggled with each consecutive row address during the first data refresh mode.

4. The memory device of claim 3, wherein the first data refresh mode comprises a CAS-before-RAS refresh mode.

5. The memory device of claim 1, wherein the first data refresh mode comprises a CAS-before-RAS refresh mode; wherein the second data refresh mode comprises a self-refresh mode; and wherein an address in at least one of the first and second periods of the self-refresh mode is equivalent to an address in the last period of a preceding CAS-before-RAS refresh mode when transitioning from the first data refresh mode to the second data refresh mode.

6. The memory device of claim 3, wherein the first data refresh mode comprises a CAS-before-RAS refresh mode; wherein the second data refresh mode comprises a self-refresh mode; and wherein an address in at least one of the first and second periods of the self-refresh mode is equivalent to an address in the last period of a preceding CAS-before-RAS refresh mode when transitioning from the first data refresh mode to the second data refresh mode.

7. The memory device of claim 6, wherein said means for generating first and second different sequences of addresses comprises a refresh address generator and a row address buffer electrically coupled to outputs of the refresh address generator.

8. A method of operating an integrated circuit memory device, comprising the steps of:

generating a first sequence of row addresses during a first data refresh mode; and generating a second sequence of row addresses, different from the first sequence of row addresses, during a second data refresh mode; and wherein at least one of the addresses in the first sequence of row addresses is repeated in the second sequence of row addresses when transitioning from the first data refresh mode to the second data refresh mode.

9. The method of claim 8, wherein the first data refresh mode comprises a CAS-before-RAS refresh mode; wherein the second data refresh mode comprises a self-refresh mode; and wherein the first two row addresses in the second sequence of row addresses are the same.

10. The method of claim 9, wherein a most significant bit of the row address is toggled with each consecutive address during the first data refresh mode.

11. The method of claim 8, wherein an address in at least one of the first and second periods of the self-refresh mode is equivalent to an address in the last period of a preceding CAS-before-RAS refresh mode when transitioning from the first data refresh mode to the second data refresh mode.

12. The method of claim 11, wherein a most significant bit of the row address is toggled with each consecutive address during the first data refresh mode.

13. A memory device, comprising:

a refresh controller;

a refresh address generator responsive to said refresh controller and having a plurality of unit counters therein; and a row address buffer having a plurality of unit buffers therein that are electrically coupled to the plurality of unit counters in said refresh address generator, and wherein a least significant unit counter in the plurality thereof has an output electrically coupled to an input of a most significant unit buffer in the plurality thereof.

14. The memory device of claim 13, wherein during a data refresh mode an input of the most significant unit buffer in said row address buffer toggles with each address generated by said refresh address generator.

15. The memory device according to claim 13, wherein said refresh controller controls said refresh address generator to generate a beginning address at least twice during one period of a self-refresh mode.

16. The memory device according to claim 13, wherein said refresh controller recognizes a disable signal of a self-refresh mode and resets the least significant unit counter.

17. The memory device according to claim 13, wherein the least significant unit counter comprises:

a toggle flip flop for generating an output and its complimentary output toggled in response to an input pulse from said refresh controller;

a switch circuit for transferring the complimentary output to an input terminal of a unit counter of a neighboring bit in a self-refresh mode and transferring the input pulse from said refresh controller to the input terminal of the unit counter of the neighboring bit in other refresh modes besides the self-refresh mode; and a reset circuit for resetting the toggle flip flop in response to a predetermined control signal from said refresh controller.

* * * * *